United States Patent [19]
Weng et al.

[11] Patent Number: 5,631,909
[45] Date of Patent: May 20, 1997

[54] METHOD AND APPARATUS FOR DETERMINING BURST ERRORS IN AN ERROR PATTERN

[75] Inventors: Lih-Jyh Weng, Shrewsbury, Mass.; Pak N. Hui, East Brunswick, N.J.; An-Loong Kok, Shrewsbury, Mass.

[73] Assignee: Quantum Corporation, Milpitas, Calif.

[21] Appl. No.: 454,959

[22] Filed: May 31, 1995

[51] Int. Cl.$^6$ .................................................. G06F 11/00
[52] U.S. Cl. ............................ 371/5.1; 371/39.1; 371/45
[58] Field of Search ........................... 371/5.1, 5.2, 38.1, 371/39.1, 43, 44, 45, 37.1

[56] References Cited

U.S. PATENT DOCUMENTS

| | | | |
|---|---|---|---|
| 3,622,984 | 11/1971 | Eastman | 371/39.1 |
| 4,059,825 | 11/1977 | Greene | 371/39.1 |
| 5,036,514 | 7/1991 | Downes et al. | 371/5.1 |
| 5,513,185 | 4/1996 | Schmidt | 371/5.5 |

Primary Examiner—Robert W. Beausoliel, Jr.
Assistant Examiner—Trinh L. Tu
Attorney, Agent, or Firm—David B. Harrison; Patricia A. Sheehan

[57] ABSTRACT

A burst error counting system determines for each sector-long error pattern a unique, minimum number of burst errors by (i) specifying, based on the statistical operation of the system, a maximum burst length, L; (ii) determining the location in the error pattern of a first erroneous bit, $b_{FIRST}$; (iii) associating the next L−1 bits with $b_{FIRST}$; (iv) incrementing a burst counter; (v) searching for a next $b_{FIRST}$ in the remaining bits of the error pattern; and (vi) repeating iii-v. The system may also store the position, that is, bit count, of these $b_{FIRST}$'s. Each time the burst error count is incremented, the system compares the count to a predetermined burst error threshold, which is equal to or less than the maximum number of burst errors that can be expected in a sector that is not corrupted to a point at which error correction may produce an incorrect result. If the number of burst errors exceeds the threshold, the system ends its burst counting operation and characterizes the sector as uncorrectable. The system may count the burst errors from both ends of the error pattern simultaneously. It thus determines the position of $b_{FIRST}$ and $b_{LAST}$ and associates with them, respectively, the succeeding L−1 bits and the preceding L−1 bits. It then determines if $b_{LAST}$ is within the L−1 bits associated with $b_{FIRST}$, and if not, the system increments its burst count by two and, as appropriate, searches for additional burst errors.

16 Claims, 5 Drawing Sheets

METHOD AND APPARATUS FOR DETERMINING BURST ERRORS IN AN ERROR PATTERN

FIELD OF THE INVENTION

This invention relates generally to error correction systems that correct errors in data encoded using an error correction code and, more particularly, to a system for counting burst errors in the decoded data.

BACKGROUND OF THE INVENTION

Data to be stored for later retrieval are typically stored in encoded form. Prior to their storage, the data symbols are encoded using an error correction code (ECC). Encoding the data avoids the loss of information through misinterpretation of the retrieved data, should one or more of the data symbols become corrupted due, for example, to a defect in the recording medium, such as a disk, or to noise signals in associated read or write channels. The result of misinterpreting the retrieved data symbols is erroneous data, and the error correction code is employed to, as the name implies, correct the erroneous data.

Specifically, before a string of data symbols is recorded, it is mathematically encoded to form ECC symbols. The ECC symbols are then appended to the data string to form data code words—data symbols plus ECC symbols—and the data code words are written to, or stored on, the disk after appropriate encoding with a modulation code. As recording densities increase, "N" code words are typically interleaved before they are recorded in a sector. When data are read from the disk, the interleaved code words are retrieved and mathematically decoded. During decoding, errors in the data are detected and, if possible, corrected through manipulation of the associated ECC symbols [For a detailed description of decoding see Peterson and Weldon, Error Correction Codes, 2d Edition, MIT Press, 1972].

When the data recorded in a sector are retrieved from storage, they are manipulated in a conventional manner to de-interleave the N code words and determine the locations of errors and the associated error values. The system then corrects the errors by combining the error values with the associated erroneous bits or symbols.

There are essentially two ways to classify errors—as random errors or as burst errors. A random error is an independent error that occurs in a code word symbol. A burst error is a sequence of contiguous bits or symbols in which at least the first bit or symbol and the last bit or symbol are erroneous, and the bits or symbols between the first and last may but need not be erroneous. Burst errors result from, for example, a storage medium defect that adversely affects a portion of a sector, and thus, affects a number of the interleaved code words. As data are stored more densely, defects in the storage medium tend to involve more and more bits, and thus, produce more and more burst errors.

Systems are more often using maximum likelihood demodulators to demodulate the retrieved data. These demodulators tend to correct random errors in the retrieved data by selecting "legitimate" sequences of bits, based on a sequence of retrieved bits that may contain one or more erroneous bits. The demodulator uses information about the modulation code to select, as the most likely recorded bits, a sequence of bits that is closest to the retrieved bits and meets the constraints of the modulation code.

The maximum likelihood demodulators may actually introduce bursty errors into the demodulation, by selecting as most likely the wrong sequence of bits. The demodulator is more apt to make such a selection if the retrieved data are corrupted.

The sequences selected by the maximum likelihood demodulator are legitimate sequences of bits, even if they are the wrong sequences, that is, even if they are not the sequences that were recorded. These sequences are then de-interleaved and decoded to reproduce the N code words.

If the retrieved data contains too many errors the data may be mistakenly demodulated, and then interpreted as different (but legitimate) code words. This is the worst type of decoding mistake, since the system "corrects" these code words, as necessary, using the ECC, and then treats the data symbols as error-free. Accordingly, as recording density increases, it is becoming more and more important to count the number of burst errors in the N retrieved code words, so that this decoding problem can be avoided by limiting error correction to those sectors that contain a relatively small number of burst errors.

A burst error occurs as a number of bits or symbols. Since all the bits or symbols in a burst need not be erroneous, there is an ambiguity in determining the start and length of each burst. There is thus a problem in determining if a retrieved sector of data contains a number of burst errors that exceeds the predetermined error correcting limit.

To count the number of burst errors in the retrieved data, the system examines the error pattern for the entire sector of data. The error pattern is determined from the error locations and the error values for the N code words. These are provided by the ECC during decoding. A zero in the pattern represents a correct bit and a one in the pattern represents an erroneous bit. The pattern includes the same number of bits as those recorded the sector.

Consider an error pattern:

---
0010001100000000001010000000000011100000 . . .
---

The number of burst errors in this segment of the pattern can be counted as:
 eight 1-bit bursts;
 three 1-bit bursts, one 2-bit burst and one 3-bit burst;
 one 1-bit burst, one 2-bit burst and two 3-bit bursts;
 one 6-bit burst, and two 3-bit bursts; and so forth.
There is thus a need for a system to determine, for an error pattern, a unique number of burst errors. Once the number of error bursts is known, such a system can restrict, or limit, its error correcting to sectors that contain up to or less than the number of burst errors that are encountered during normal operations of the system.

SUMMARY OF THE INVENTION

The invention is a burst error counting system that determines for each error pattern a unique, minimum number of burst errors by (i) specifying, based on the statistical operation of the system, a maximum burst length, L, which, as discussed below, is the longest burst that the system "generates;" (ii) determining the location in the error pattern of a first erroneous bit; (iii) associating the next L−1 bits with the erroneous bit; (iv) incrementing a burst counter; (v) searching for the first bit of a next burst error in the remaining bits of the error pattern; and (vi) repeating iii-v. The system may also store the positions of these first erroneous bits for later use.

More specifically, the system associates with each burst error at least the bits included in that burst and may associate with it a number of non-erroneous bits that follow the burst. Assume, for example, that the maximum burst length is 6, i.e., L=6, and the first erroneous bit of a burst error, $b_{FIRST}$, and the succeeding L−1, or 5, bits are 110100. The system associates with $b_{FIRST}$ both the sequence of bits included in the actual burst error (i.e., 1101) and the two non-erroneous bits that follow the burst. If, for example, the last bit were instead erroneous, both of the bits would be included in the actual burst error. However, since they are non-erroneous and any succeeding erroneous bit is beyond the maximum length, they are not part of this actual burst error or a next actual burst error. Accordingly, associating them with this burst error does not alter the count of the burst errors in the code word error pattern.

Each time the burst error count is incremented, the system compares the count to a predetermined burst error threshold, which is less than or equal to the number of burst errors that the system can expect in a sector of data. If the number of burst errors exceeds the threshold, the system may characterize the code words as uncorrectable. As discussed in more detail below, the threshold is based on the performance statistics of the system.

In an alternative embodiment, the system counts the burst errors simultaneously from both ends of the error pattern. It thus determines the positions in the pattern of a first erroneous bit, $b_{FIRST}$, and a last erroneous bit, $b_{LAST}$. Next, it associates with these bits the succeeding or proceeding L−1 bits, as appropriate. If the bit position of the L−1$^{st}$ bit associated with the first burst error is the same as or beyond the position of $b_{LAST}$, the system determines that the two erroneous bits $b_{FIRST}$ and $b_{LAST}$ are within the same burst error, and thus, that the error pattern contains a single burst error.

Otherwise, the system determines that there are at least two burst errors. It then increments its burst count by two and continues searching through the remaining error pattern for additional burst errors.

If additional erroneous bits $b_{FIRST}$ and $b_{LAST}$ are found in the error pattern, the system associates with them the appropriate succeeding and preceding L−1 bits and again checks if they should be treated as a single burst error. If so, the system has found all of the burst errors. Accordingly, it increments its burst count by one and stops its burst counting operations. Otherwise, the system increments the burst count by two and continues searching for additional burst errors, as long as the burst count is below the burst error threshold.

If the burst error threshold is two, the system locates $b_{FIRST}$ and $b_{LAST}$ and sets to all zeros $b_{FIRST}$ and the succeeding L−1 bits and $b_{LAST}$ and preceding L−1 bits. It can then readily determine from the altered error pattern whether or not there are additional burst errors, by searching for any 1's in the pattern.

The system may reduce the length of the error pattern, and free buffer space, by limiting to L−1 the number of zeros between consecutive 1's. The system then counts the burst errors by searching through the reduced number of bits.

The system in all of its embodiments determines for an error pattern a unique, minimum count of the burst errors. The particular burst error patterns and locations may differ, depending on whether the system searches the error pattern from one end or both ends. However, the count of the burst errors remains the same.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
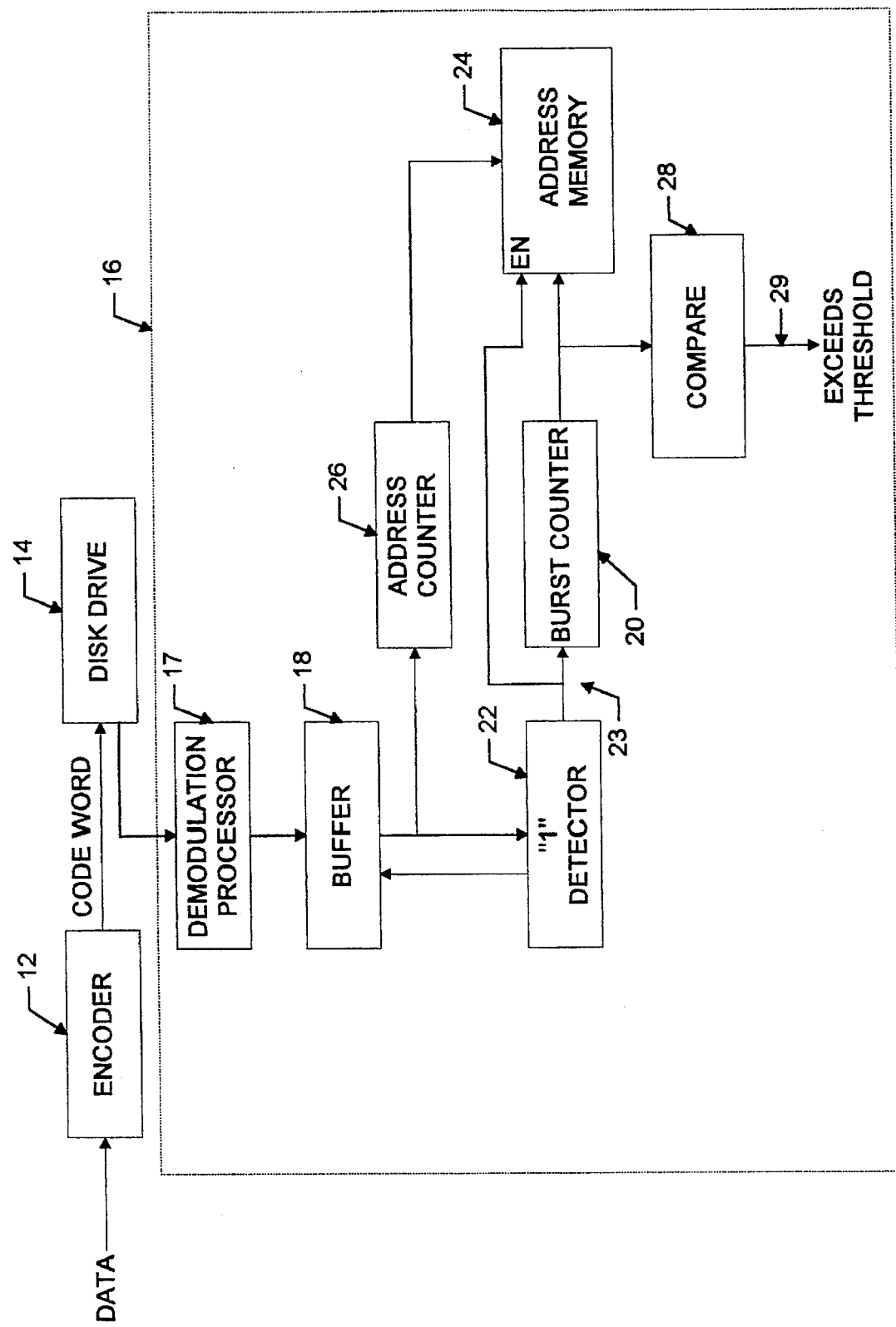
FIG. 1 is a functional block diagram of a system constructed in accordance with the invention.

FIG. 1 depicts a system 10 in which an encoder 12 encodes data symbols in a conventional manner to produce error correction code (ECC) symbols. The encoder 12 concatenates the ECC symbols to the data symbols to form a code word. It then interleaves N code words and sends them to a storage device 14 for storage in a sector on a recording medium, such as a magnetic disk (not shown).

Figure 2:
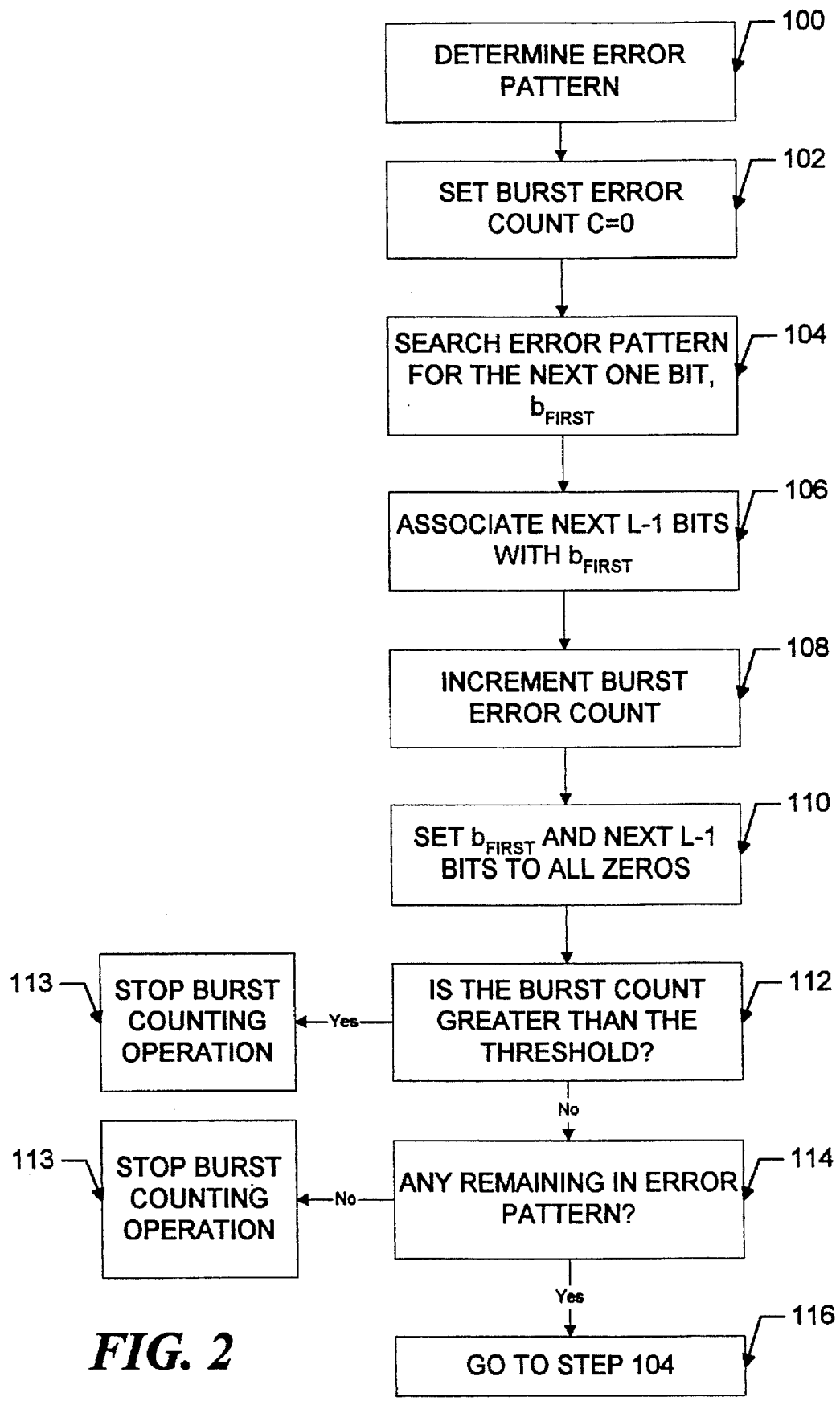
FIG. 2 is a flow chart of the operations of a decoder that is included in the system of FIG. 1.

Referring also to FIG. 2, when the sector of data is retrieved from storage, the decoder 16 demodulates, de-interleaves and decodes the data in a conventional manner in processor 17. The decoding produces a sector-long error pattern that consists of a sequence of zeros and ones, with ones representing erroneous bits and zeros representing nonerroneous bits. It then stores the error pattern in a buffer 18 (step 100).

As an example assume the error pattern is:

---

0010000101110001000000000000000000001010000000011111110000000000 ...

---

The decoder 16 sets its burst counter 20 to c=0 and a "1" detector 22 searches the contents of the error pattern buffer 18 for a first one bit, $b_{FIRST}$ (steps 102–104). The position of this bit in the error pattern is the start of a first burst error. In the example, the detector 22 stops its search at the third bit.

The decoder 16 then determines a first potential burst error, $e_{p1}$, by associating with bit $b_{FIRST}$ the next L−1 bits, where L is the maximum burst length associated with the system (step 106).

The maximum burst length, L, is an error statistic that is specific to the system. It is based, for example, on the type of system, i.e., optical, tape, magnetic disk; the density of recording; and so forth, and is determined experimentally. In the example, L=6 and the system associates with bit $b_{FIRST}$ the next 5 bits. Accordingly, the first potential burst error, $e_{p1}$, is thus 100001.

If the system is only counting the burst errors and does not at this time require that the starting location of the errors or the actual burst error patterns be saved, the system increments the burst error counter 20 to c=1 and sets the corresponding L bits in the code word error pattern to all zeros (steps 108–110). The code word error pattern is now:

00000000011100010000000000000000000001010000000011111000000000 . . .

The decoder also compares its burst count to a predetermined burst error threshold, which is equal to or less than the maximum number of burst errors that the system "expects" in an error pattern that corresponds to a sector of data that is not so corrupted that the ECC may inaccurately "correct" the data (step 112). This burst error threshold is also determined experimentally for a particular system. For example, the system may occasionally encounter error patterns with at most two burst errors and encounter significantly more burst errors only when a sector is corrupted beyond the point at which the error correction system always correctly reproduces the recorded data. Such a system would have its threshold set to two or perhaps three, to avoid labeling good sectors as uncorrectable.

If the burst count is greater than the burst error threshold, the system stops its burst counting operation (steps 112–113). Otherwise, the system searches for the next 1 in the remaining bits in the error pattern (steps 114–116).

Assuming the threshold has not been reached, the decoder 16 again begins its searches for a first 1 bit in the pattern and ends this search at the ninth bit, which becomes the next $b_{FIRST}$. The decoder next associates the succeeding L−1, or 5, bits with $b_{FIRST}$, to produce the second potential burst error, $e_{p2}$, of 111000. The decoder increments its burst count to c=2 and sets these L bits to all zeros. It then compares the burst count to the burst error threshold and determines if the count exceeds the threshold. If so, the system ends its burst error counting operation. Otherwise, it repeats its burst counting operations until either the burst error threshold is exceeded or it reaches the last bit in the error pattern.

To save the information relating to the burst error locations, the detector 22 enables an address memory 24. This memory stores, in a memory location addressed by the count of burst counter 20, a bit count from an address counter 26, which counts the bits in the error pattern as these bits are searched.

The detector 22 operates in a conventional manner to detect 1's in the error pattern. In an exemplary system, the detector 22 retrieves the error pattern from the error pattern buffer 18 (FIG. 1) as a serial stream of bits, and "tests" each bit to find the first 1 bit. The address counter 26 thus counts the bits as they are applied to the detector. As is well known to those skilled in the art, the detector 22 could instead retrieve the error pattern in parallel from the buffer 18, and use a combinational search and counting mechanism to determine the position of a first 1 in the pattern.

When the detector 22 detects the first 1 in the error pattern, it asserts a signal on line 23. The asserted signal increments the count of the burst counter 20 and enables a burst error address memory 24. The memory 24 stores the count of the address counter 26 in the memory location addressed by the burst count, to indicate the first bit position of the first burst error. The detector then leaves asserted the signal on line 25 for the next L−1 bits. Thereafter, the detector de-asserts the signal on line 25 until a next 1 is detected in the code word error pattern.

Each time the burst counter 20 is incremented, its count is compared to a predetermined error threshold by comparator 28. The burst error threshold is equal to or less than the maximum number of burst errors that are expected in a sector that is not corrupted to the point that the error correction performed by the system is questionable. If the sector includes too many burst errors, it is at least somewhat likely that the corrected data are not the data that were recorded on the disk, but instead other data that were produced through a combination of inaccurate demodulation and error correction of the resulting data.

If the burst count exceeds the burst error threshold, the comparator asserts a signal on line 29 and the system 10 (FIG. 1) responds appropriately by, for example, labeling the code word as uncorrectable. It thus rejects the corrected data as inaccurate.

Figure 3:
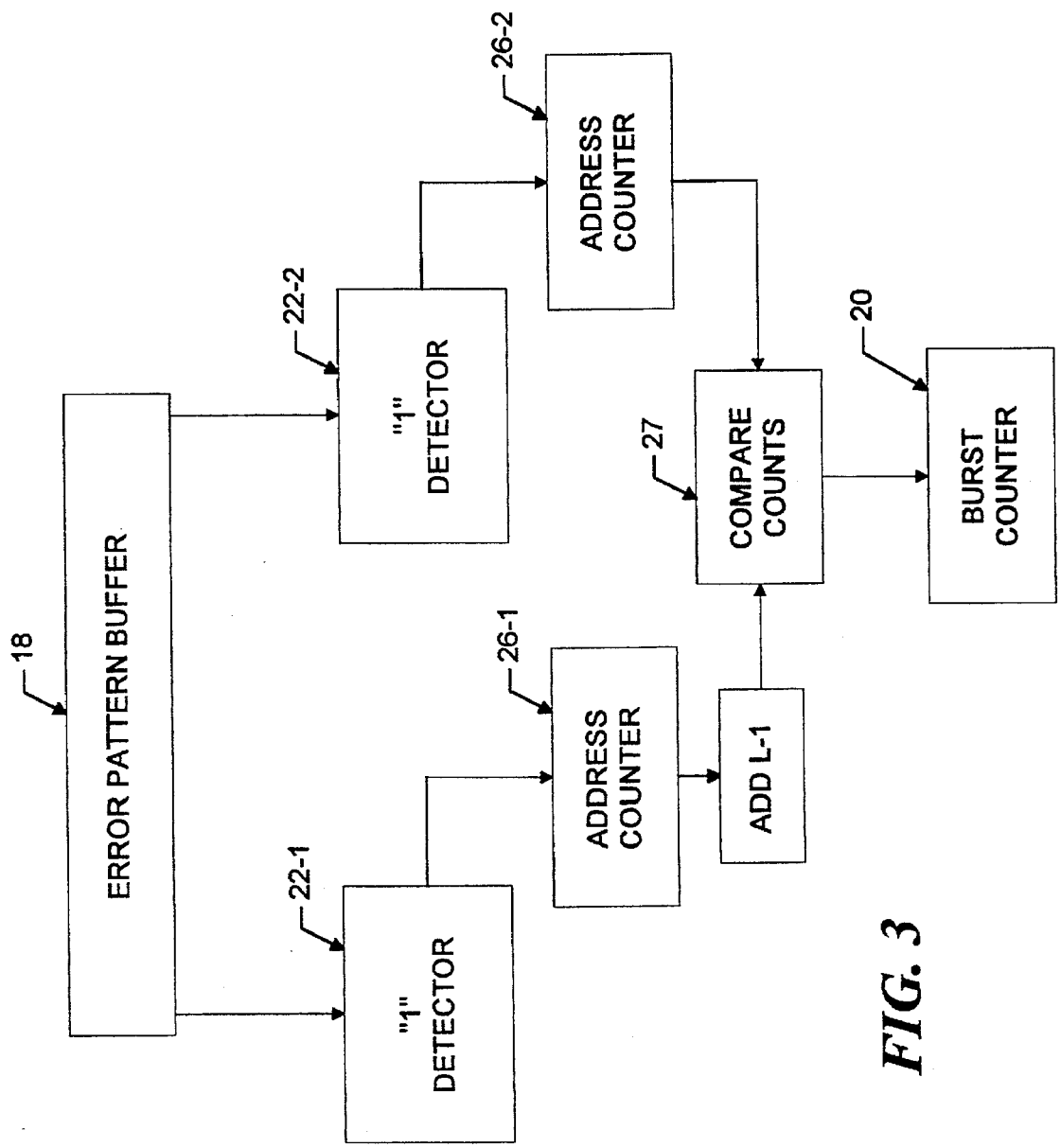
FIG. 3 depicts the decoder of FIG. 2 with increased storage capabilities.
Figure 4:
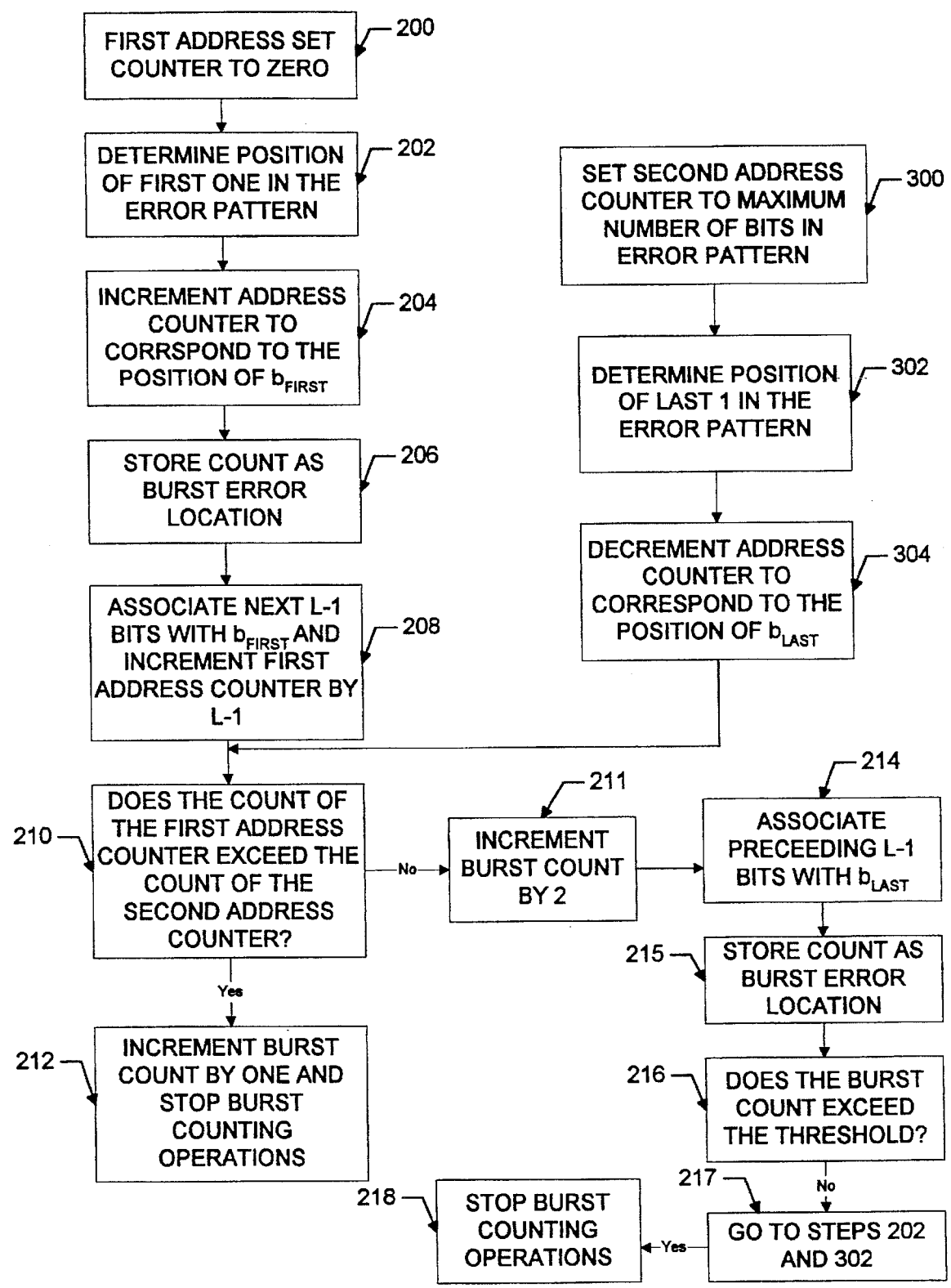
FIG. 4 depicts an alternative decoder.

In an alternative embodiment, the decoder 16 counts burst errors simultaneously from both ends of the error pattern. The decoder 16 thus includes two detectors 22-1 and 22-2 and two address counters 26-1 and 26-2, as depicted in FIG. 3. Referring also to FIG. 4, the detector 22-1 determines the first position of a 1 in the error pattern by examining succeeding bits of the error pattern, starting from the end of the pattern that corresponds to the start of the error pattern (step 202). The associated address counter 26-1, which is initially set to zero, increments its count for each bit examined by the detector 22-1 (steps 200, 204). At the same time, the detector 22-2 starts searching for 1's from the end of the pattern that corresponds to the end of the date (step 302). The associated address counter 26-2 starts its count at the total bit count of the error pattern, and decrements its count for each bit examined by the detector 22-2 (steps 300, 304).

Once the detectors 22-1 and 22-2 each detect a 1, respectively, $b_{FIRST}$ and $b_{LAST}$, the decoder 16 determines if the two 1's should be included in the same or different burst errors. The decoder 16 first stores the address count of $b_{FIRST}$ in the address memory, since it is the first bit of at least the first burst error in the pattern. (step 206). The decoder next associates L−1 bits with $b_{FIRST}$ and determines from the count of address counter 26-1 the position of the L−1$^{st}$ bit (step 208). If this bit position is beyond the position of $b_{LAST}$, that is, if processor 27 determines that the count of address counter 26-1 is greater than the count of address counter 26-2, the system includes $b_{FIRST}$ and $b_{LAST}$ in the same burst error. The burst counter is then incremented by one and the decoder stops its burst counting operations (steps 210, 212).

If the position of the last of the L−1 bits is not beyond $b_{LAST}$, the system increments the burst counter 20 by two, associates the preceding L−1 bits with $b_{LAST}$ and stores the count of the address counter 26-2 in the burst error address memory 24 as the location of a second burst error (steps 211, 214, 215).

The decoder next sets to all zeros $b_{FIRST}$ and the associated succeeding L−1 bits, and $b_{LAST}$ and the associated preceding L−1 bits. If the burst count does not exceed the burst error threshold, the system searches the remaining bits of the code word error pattern from both ends and determines the positions of any additional burst errors (steps 216–218).

Figure 5:
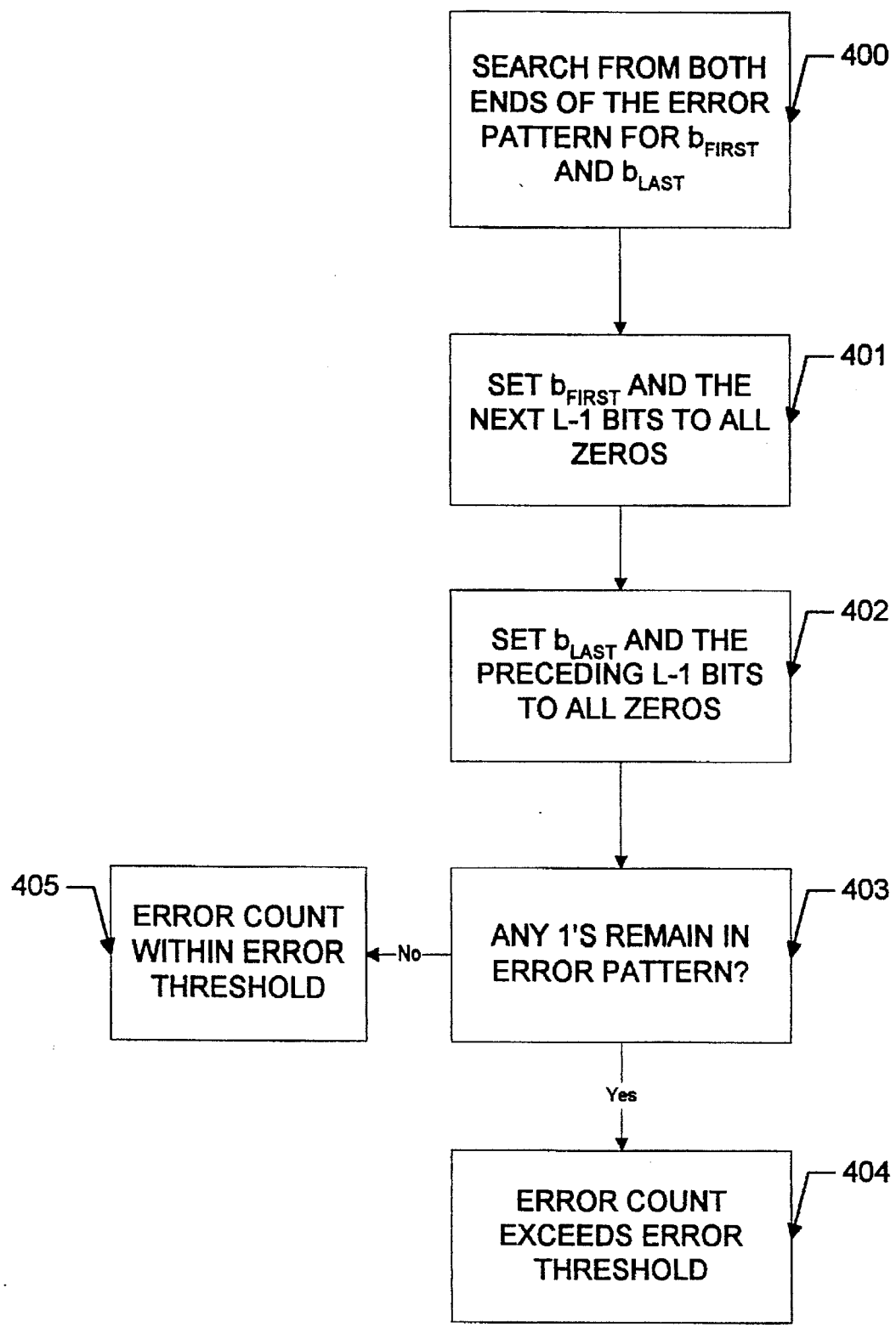
FIG. 5 is a flow chart of the operations of the decoder of FIG. 4.

If the burst error threshold is two, the system may use a simplified operation to determine if the number of burst errors exceeds the threshold. Referring now to FIG. 5, the decoder 16 searches the error pattern from both ends for $b_{FIRST}$, the first 1 in the error pattern, and $b_{LAST}$, the last 1 in the error pattern (step 400). It then sets to all zeros the bits $b_{FIRST}$ through $b_{FIRST+L-1}$ and bits $b_{LAST}$ through $b_{LAST-(L-1)}$ (steps 401–402). Next, it determines if any 1's remain in the error pattern (step 403). If so, the system determines that the pattern contains three or more burst errors, and thus, that the error threshold is exceeded (step 404). Otherwise, the system determines that there are at most two burst errors, and thus, that the error correction operations accurately reproduced the recorded data (step 405).

To free buffer space, the system may limit to L–1 the number of consecutive zeros between any two 1's in the error pattern. Consider the exemplary error pattern:

```
00100001011100010000000000000000000001010000000011111000000000 ...
```

By limiting the number of consecutive zeros to L–1, the error pattern becomes:

```
10000101110001000001010000011111 ...
```

The length of the pattern is thus reduced, without altering the burst error count, which remains at 5. If the burst errors are spread out in the error pattern, a significant amount of buffer space can be freed by limiting the included sequences of consecutive zeros.

Another way to free buffer space is to separate the error pattern into segments. The segments begin and end with 1's and their boundaries are determined by strings of L–1 or more zeros. The error pattern thus becomes

```
100001    1110001    101    111110
``` and the burst errors are determined by associating up to L–1 bits with the first bit in each segment and any remaining 1's in a segment with subsequent burst errors. As illustrated by the underlined portions:

```
100001    111000 1    101    11111
``` the burst error count remains at 5, with the second segment containing two burst errors.

If the number of symbols in the burst errors, rather than the number of bits, is important, the decoder 16 counts "symbol burst errors" by first mapping the symbols that represent the error pattern to a binary sequence in which the 1's represent erroneous symbols and the 0's represent error-free symbols. Thus, the bits in the error pattern are first mapped to symbols and the symbols, in turn, are mapped to the binary sequence. The decoder then counts the bursts in the binary sequence as described above and compares the count to an associated symbol burst error threshold.

As an example, consider the sequence:

```
000000000S₁S₂00000000000S₃S₄S₅S₆S₇000000000000S₈S₉S₁₀00000000000 ...
``` in which the $S_i$'s represent erroneous symbols. This sequence is mapped to the binary sequence

```
000000000110000000000011111000000000000111000000000000 ...
```

The decoder 16 counts the bursts of symbols by detecting the first 1 in the sequence and associating with it the appropriate L–1 bits. It then increments its burst count and searches for a next 1 in the remaining sequence. If L=6, the system counts 3 symbol burst errors.

As discussed above, the decoder 16 determines for each error pattern a unique, minimum number of burst errors of less than or equal to a predetermined size. The decoder determines burst errors based either on a number of bits or a number of symbols, as appropriate. Further, the system limits the data sectors it treats as accurately corrected to those sectors that contain fewer than a predetermined number of burst errors. In this way, the system avoids potentially misinterpreting one or more of the code words contained in the sector.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A system for counting burst errors, the system including:
   A. means for producing an error pattern consisting of ones representing erroneous bits and zeros representing non-erroneous bits of N code words that are recorded together;
   B. a burst counter for maintaining a burst count of burst errors, the counter being initially set to zero;
   C. burst detecting means for determining a position in the error pattern of a next bit, $b_{FIRST}$, with a value of one;
   D. means for associating the next L–1 bits in the error pattern with the bit $b_{FIRST}$, where L is a maximum burst length associated with the system, and
   E. means for incrementing the burst count for each bit, $b_{FIRST}$, located by the burst detecting means, the burst detecting means determining the position of a next bit $b_{FIRST}$ with a value of one in the bits of the error pattern that follow the L–1 bits that were associated with the previous $b_{FIRST}$ bit, and the burst counter counting the number of burst errors in the error pattern by counting the number of $b_{FIRST}$ bits determined by the burst detecting means.

2. The system of claim 1, wherein the system further includes means for comparing the burst count with a predetermined burst error threshold, said means preventing the system from continuing to count burst errors if the burst error count exceeds the threshold.

3. The system of claim 2, wherein the system still further includes a buffer for holding the error pattern, the buffer including means for limiting to L−1 the number of zero bits between consecutive one bits.

4. The system of claim 2, wherein the system still further includes:
  i. an address counter for determining a bit count for $b_{FIRST}$; and
  ii. a memory for storing the count of the address counter as an indication of the location of the burst errors.

5. The system of claim 2, wherein the system still further includes:
  i. a second burst detector means for determining the position in the error pattern of a last bit, $b_{LAST}$, that has a value of one by starting from an end of the pattern that is associated with the last bit of the code word and searching the preceding bits of the error pattern;
  ii. means for determining if the bits $b_{FIRST}$ and $b_{LAST}$ are included in a same burst error, said means determining the bits are in the same burst error if the bit $b_{LAST}$ is one of the L−1 bits associated with the bit $b_{FIRST}$;
  iii. means for incrementing the burst count by two if the bits $b_{FIRST}$ and $b_{LAST}$ are not part of the same burst error, said means incrementing the burst count by one if the bits $b_{FIRST}$ and $b_{LAST}$ are part of the same burst error.

6. The system of claim 5, wherein the system still further includes:
  i. an address counter for determining, respectively, a bit count for $b_{FIRST}$ and a bit count for the bit that precedes $b_{LAST}$ by L−1 bits; and
  ii. a memory for storing the counts of the address counter as indications of the locations of the two burst errors.

7. A system for determining if a sector of data contains more than two burst errors, the system including:
  A. means for producing an error pattern consisting of ones representing erroneous bits and zeros representing non-erroneous bits of the sector of data, the error pattern having first and second ends, the first end being associated with the first bit of the sector and the second end being associated with the last bit of the sector;
  B. first burst detecting means for determining a position in the error pattern of a next bit, $b_{FIRST}$, with a value of one, the first burst detecting means starting at the first end of the error pattern;
  C. second burst detecting means for determining the position in the error pattern of a preceding bit, $b_{LAST}$, with a value of one, the second burst detecting means starting at the second end of the error pattern;
  D. zeroing means for (i) setting the bit $b_{FIRST}$ and the next L−1 bits in the error pattern to all zeros, and (ii) setting the bit $b_{LAST}$ and the preceding L−1 bits in the error pattern to all zeros, where L is a maximum burst length associated with the system; and
  E. means for determining if any bit in the error pattern has a value of one after the zeroing means sets the L bits to zeros, said means asserting an error signal if any bit with a value of one remains in the error pattern.

8. A system for correcting errors in a sector of N code words, the system including:
  A. means for producing a sector-long error pattern consisting of ones representing erroneous bits and zeros representing non-erroneous bits;
  B. a burst counter for maintaining a burst count of burst errors, the counter being initially set to zero;
  C. burst detecting means for determining a position in the error pattern of a next bit, $b_{FIRST}$, with a value of one;
  D. means for associating the next L−1 bits in the error pattern with the bit $b_{FIRST}$, where L is a maximum burst length associated with the system; and
  E. means for incrementing the burst count for each bit, $b_{FIRST}$, located by the burst detecting means, the burst detecting means determining the position of a next bit $b_{FIRST}$ with a value of one on the bits of the error pattern that follow the L−1 bits that were associated with the previous $b_{FIRST}$ bit.

9. The system of claim 8, the system further including comparing means for comparing the burst count with a predetermined burst error threshold, the comparing means preventing the system from correcting errors in the code word if the burst count exceeds the threshold.

10. The system of claim 9, wherein the system still further includes a buffer for holding the error pattern, the buffer including means for limiting to L−1 the number zero bits between consecutive one bits.

11. The system of claim 9, wherein the system still further includes:
  i an address counter for determining a bit count for $b_{FIRST}$; and
  ii. a memory for storing the counter of the address counter as an indication of the location of the burst errors.

12. The system of claim 9, wherein the system still further includes:
  i. a second burst detector means for determining the position in the error pattern of a last bit, $b_{LAST}$ with a value of one, the second burst detector means searching the preceding bits of the error pattern from an end of the pattern associated with the last bit of the sector;
  ii. means for determining if the bits $b_{FIRST}$ and $b_{LAST}$ are included in a same burst error, said means determining the bits are in the same burst error if the bit $b_{LAST}$ is one of the L−1 bits associated with the bit $b_{FIRST}$;
  iii. means for incrementing the burst count by two if the bits $b_{FIRST}$ and $b_{LAST}$ are not part of the same burst error, said means incrementing the burst count by one if the bits $b_{FIRST}$ and $b_{LAST}$ are part of the same burst error.

13. The system of claim 12, wherein the system still further includes:
  i. an address counter for determining, respectively, a bit count for the bits $b_{FIRST}$ and a bit count for L−1 bits that precede the $b_{LAST}$ bit; and
  ii. a memory for storing the counts of the address counter as indications of the locations of the burst errors.

14. The system of claim 13 wherein the means for producing an error pattern includes for mapping erroneous symbols to a sequence of bits.

15. A system for determining if a sector contains more than two burst errors, the system including:
  A. means for producing an error pattern consisting of ones representing erroneous symbols and zeros representing non-erroneous symbols, the error pattern having first and second ends, the first end being associated with the first symbol of the sector and the second end being associated with the last symbol of the sector;
  B. first burst detecting means for determining the position in the error pattern of a next bit, $b_{FIRST}$, that has a value of one, the first burst detecting means starting at the first end of the error pattern;
  C. second burst detecting means for determining the position in the error pattern of a bit, $b_{LAST}$, the second burst detecting means starting at the second end of the error pattern;

D. zeroing means for (i) setting the bit $b_{FIRST}$ and the next L–1 bits in the error pattern to all zeros, and (ii) setting the bit $b_{LAST}$ and the preceding L–1 bits in the error pattern to all zeros., where L is a maximum burst length associated with the system; and E. means for determining if any bit in the error pattern has a value of one after the zeroing means sets bits to zeros, said means asserting an error signal if any bit with a value of one remains in the error pattern.

16. The system of claim 15 wherein the means for producing an error pattern includes means for mapping erroneous symbols to a sequence of bits.

* * * * *